United States Patent
Reiss et al.

(10) Patent No.: US 8,822,003 B2
(45) Date of Patent: Sep. 2, 2014

(54) COMPONENT HAVING AN OVERLAPPING LASER TRACK; METHOD FOR PRODUCING SUCH A COMPONENT

(75) Inventors: Kunibert Reiss, Pechbrunn (DE); Thomas Karl, Wunsiedel (DE); Claus Peter Kluge, Röslau (DE)

(73) Assignee: CeramTec GmbH (DE)

( * ) Notice: Subject to any disclaimer, the term of this patent is extended or adjusted under 35 U.S.C. 154(b) by 191 days.

(21) Appl. No.: 13/259,449

(22) PCT Filed: Mar. 26, 2010

(86) PCT No.: PCT/EP2010/053972
§ 371 (c)(1),
(2), (4) Date: Sep. 23, 2011

(87) PCT Pub. No.: WO2010/112412
PCT Pub. Date: Oct. 7, 2010

(65) Prior Publication Data
US 2012/0015129 A1      Jan. 19, 2012

(30) Foreign Application Priority Data

Mar. 31, 2009   (DE) .......................... 10 2009 015 087

(51) Int. Cl.
| | | |
|---|---|---|
| *B32B 3/24* | (2006.01) | |
| *B23K 26/40* | (2014.01) | |
| *B23K 26/06* | (2014.01) | |
| *H01L 21/78* | (2006.01) | |
| *C03B 33/02* | (2006.01) | |
| *B23K 26/36* | (2014.01) | |
| *C03B 33/08* | (2006.01) | |

(52) U.S. Cl.
CPC ........... *B23K 26/408* (2013.01); *B23K 26/0626* (2013.01); *H01L 21/78* (2013.01); *C03B 33/0222* (2013.01); *B23K 26/367* (2013.01); *C03B 33/082* (2013.01); *B23K 2201/40* (2013.01)
USPC ............................................................ 428/43

(58) Field of Classification Search
CPC .................... H05K 2201/0909; B23K 26/383; B23K 26/381
USPC ............................................................ 428/43
See application file for complete search history.

(56) References Cited

U.S. PATENT DOCUMENTS 6,872,436 B2 * 3/2005 Suzuki et al. ................... 428/43
2005/0155954 A1 * 7/2005 Oba et al. ................. 219/121.67

(Continued)

FOREIGN PATENT DOCUMENTS

| DE | 10 2007 014 433 A1 | 10/2007 |
| WO | WO2008/062496 | * 5/2008 |
| WO | WO 2009/060048 A1 | 5/2009 |

OTHER PUBLICATIONS

Machine translation of WO 2008/062496, retrieved Sep. 11, 2013.*

*Primary Examiner* — Alexander Thomas
(74) *Attorney, Agent, or Firm* — Fulbright & Jaworski LLP

(57) ABSTRACT

A component having a laser track as a fracture initiation line, said laser track being composed of laser holes formed by a laser beam for preparing for a later separation of the component into individual components. In order to ensure that, upon separation, the fracture always extends along the laser track, fractures deviating from the laser track are avoided, and the fracture edges after fracture are formed evenly and do not have jagged edges, it is proposed that the distance between two adjacent laser holes be less than or equal to the diameter of said laser holes, in each case measured on the surface of the component.

14 Claims, 3 Drawing Sheets

(56) References Cited

U.S. PATENT DOCUMENTS

| | | |
|---|---|---|
| 2005/0263854 A1 | 12/2005 | Shelton et al. |
| 2006/0255022 A1 | 11/2006 | Hoshino et al. |
| 2007/0090100 A1 | 4/2007 | Yonai et al. |
| 2009/0220721 A1* | 9/2009 | Matsusaki ............ 428/43 |

* cited by examiner

COMPONENT HAVING AN OVERLAPPING LASER TRACK; METHOD FOR PRODUCING SUCH A COMPONENT

This application is a §371 of PCT/EP2010/053972 filed Mar. 26, 2010, and claims priority from DE 10 2009 015 087.0 filed Mar. 31, 2009

FIELD OF THE INVENTION

The invention describes a component comprising a laser track as a fracture initiation line, said laser track consisting of laser holes formed by a laser beam for preparing for a later separation of the component into individual components. Moreover, a method for producing such a component is described.

BACKGROUND OF THE INVENTION

For producing predetermined breaking points in ceramic components, among others, the laser method is used. For a cost-effective production of individual, components, the components prepared by a laser are processed in multiple-up production and subsequently separated into individual components (one-up production). For this, holes are put in at defined distances into the surface of the components, similar to a perforation. These weak points created therein act as fracture initiation line and reduce the fracture force at selected locations and enable predetermined fracture propagation.

Such a method is used to replace mechanical cutting methods and/or embossing methods and has established itself also in the field of scribing techniques. Here, blind holes are linearly arranged in a row and serve as a predetermined breaking points or fracture initiation lines on components made of brittle materials such as cast metals or ceramics.

It is standard for laser scribing that the holes are put into the material at defined distances.

With this method it is possible that the perforation causes deviations from the predetermined breaking points. Under certain circumstances, asymmetrical fracture propagations can occur. After the separation, a portion of the side faces have a sequence of semicircles and webs (see FIG. 1) and, compared to a mechanically generated, almost smooth notch surface, can be designated as macroscopically rough. Particular attention is paid here to individual webs projecting from the predetermined fracture line.

Hereinafter, a laser scribing line or laser track is to be as an imaginary line which runs through the centers of all holes.

OBJECTS AND SUMMARY OF THE INVENTION

It is an object of the invention to provide a component comprising a laser track which component ensures that upon separation, the fracture always extends along the laser track, fractures deviating from the laser track are avoided, and the fracture edges after fracturing are formed evenly and do not have jagged edges.

This object is achieved by the features of the invention as described herein.

DETAILED DESCRIPTION

Figure 1:
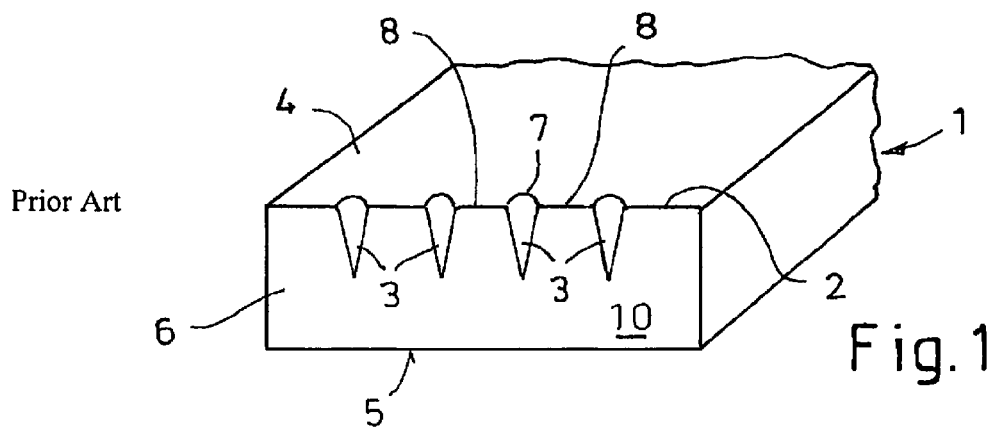
FIG. 1 shows a section through a component 1 according to the prior art along the laser track 2.

Due to the fact that the distance A between two adjacent laser holes is smaller or equal to the diameter D of said laser holes, in each case measured on the surface of the component, the fracture always extends along the laser track, fractures deviating from the laser track are avoided and after fracturing, the fracture edges are formed evenly and do not have jagged edges.

The laser hole is a point, around which a circular crater is created within an irradiation time T. The diameter of the crater is measured on the surface and has a diameter D and a depth H. The distance between two laser holes is designated as distance A.

In the method according to the invention, the distance A can become zero. As a result of this, a laser track is generated. The individual laser hole has the shape of a funnel-shaped blind hole. The structure of a laser track implemented by laser holes spaced at very small distances from each other has a notch-like shape. Hereby, a notch structure is obtained along the laser track.

By means of a separating step, two new side faces are generated from one laser track. Hereinafter, side faces are to be understood as partial surfaces of any body. The sum of all partial surfaces results in the surface of the body. In case of porous materials, only the enveloping surface is considered without the inner surface, for example in case of open porosity.

A component can be a three-dimensional body of any shape or also a flat component with two approximately plane-parallel surfaces. A flat component is to be understood as a plate.

In one configuration according to the invention, the depth H of the laser holes is equal. As a result, the depth of the laser track is the same everywhere and all areas of the laser track are equal with respect to breakability.

In another configuration according to the invention, the depth H of the laser holes is unequal. For example, at particularly critical places, the laser track can be deeper than at other places so that at these places, breakability is improved. Since the depth of the laser holes is extremely important for breakability, the depth has to be selected depending on the requirements.

In order to further improve breakability, the laser track can be generated in opposing side faces of the component. After laser scribing and prior to fracturing, only a web arranged in the inside remains at these places, wherein the respective laser holes of both side faces open out into said web.

In another embodiment variant of the invention, the components comprise congruent laser tracks on opposing side faces. As a result, breakability is equal on both side faces, i.e. the component can be separated as needed.

In one preferred embodiment, the component consists of a ceramic material or glass such as, for example, semiconductor materials, aluminum oxides, zirconium oxides or mixed ceramics. In one preferred configuration, ceramics are used.

In one advantageous configuration, the components are ceramic plates which are used for electronic or electric components. In particular in case of substrates, the benefit of multiple-up production is enormous.

The component can also be a polymer filled with solids and/or can be an unfilled polymer. Said polymer filled with solids is preferably a non-sintered ceramic film. In another configuration, the film contains in the inside a non-sintered ceramic material which is enveloped by a polymer.

The method according to the invention for producing the component is characterized in that during the irradiation time of the component, the laser beam and/or the component are moved so as to implement the laser track.

In one advantageous embodiment, a laser hole is implemented at least a second time at the same place. Hereby, the depth and/or the size of the laser track can be formed in a specific manner.

The invention is illustrated in more detail below by means of 6 figures.

Figure 2:
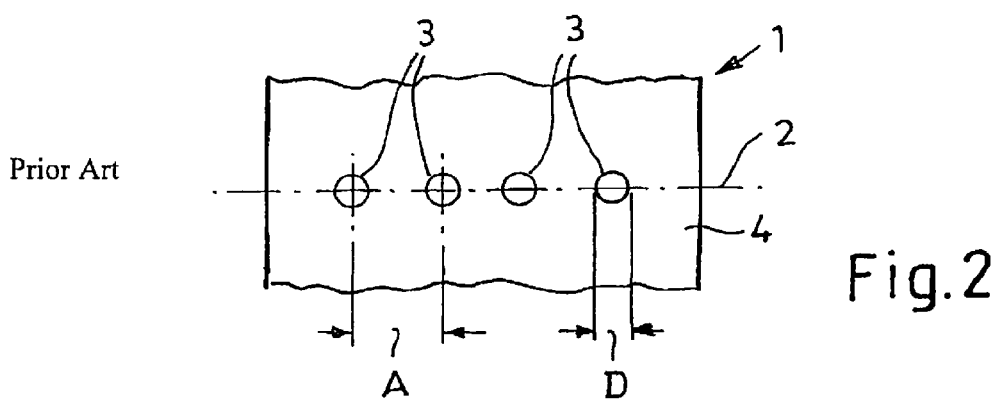
FIG. 2 shows a view of the component shown in FIG. 1.

FIG. 1 shows a section through a component 1 according to the prior art along the laser track 2. FIG. 2 shows a view of this component. Both figures show the same component comprising a laser track 2 as a fracture initiation line, said laser track consisting of laser holes 3 formed by a laser beam for preparing for a later separation of the component 1 into individual components which are not shown here. Said component 1 carries the laser track 2 inside after lasering and prior to the separation. After separating the component 1, two individual components are generated. Said laser track 2 acts as a fracture initiation line and facilitates the separation of the component along the laser track 2. The laser track 2 is preferably implemented on a side face such that it is visible from the outside. The component is then fractured along the laser track 2. Thereby, the laser track becomes an outer edge of the individual component. Two new side faces are created.

The components shown in the FIGS. 1 and 2 consist of a ceramic material and are substrates which are provided with laser holes 3 according to the prior art which serve as fracture initiation points. Once this component 1 is fractured along the laser track and separated, two individual components are created. At the location of the laser holes, the fracture surface shows semicircles 7 which are each framed by webs 8.

Figure 3:
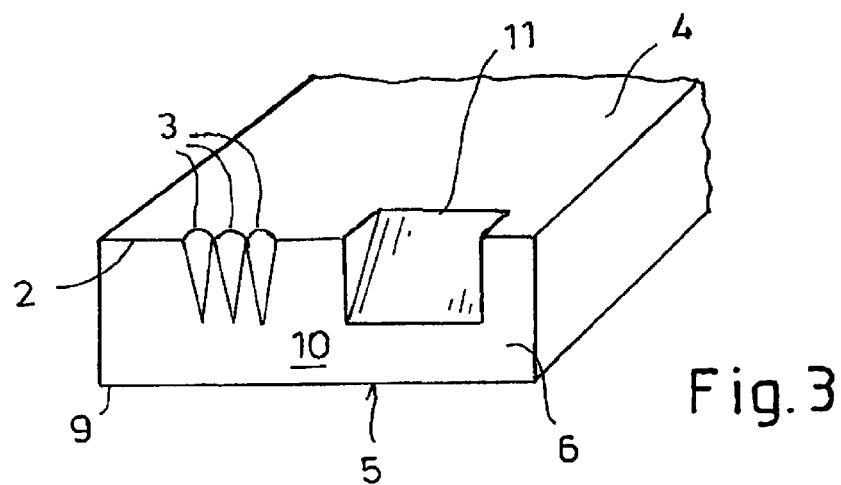
FIG. 3 shows an individual component 9 which was generated from a component 1 according to the invention by fracturing along the laser track 2.

FIG. 3 shows an individual component 9 which was generated from a component 1 according to the invention by fracturing along the laser track 2, i.e. it shows a portion of the component after separation. In the embodiment shown here, the laser holes 3 adjoin each other so that the distance A between two adjacent laser holes 3 is smaller or equal to the diameter D of said laser holes 3, in each case measured on the surface of the component. The fracture surface is designated by the reference number 6. The reference number 11 designates a recess which is necessary for the use of the individual component. It is shown here that the laser track 2 can also be combined with any recesses 11. In the embodiment shown here, some regions of the laser track 2 are without laser holes 3; this can be useful in specific embodiments. However, the laser holes 3 are usually arranged continuously on the entire laser track 2. The figures are schematized so that no measurements can be taken therefrom.

FIG. 2 shows the distance A and the diameter D for illustration purposes.

Figure 4:
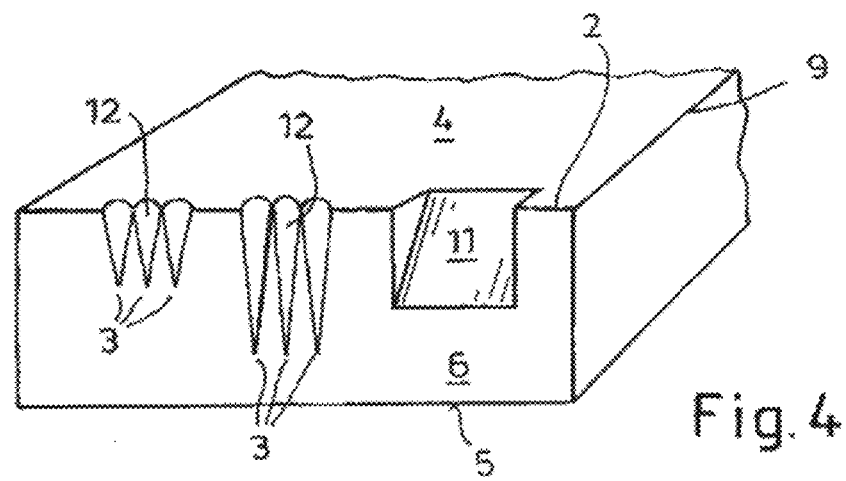
FIG. 4 shows an embodiment of the present invention wherein laser holes are put in from only one side face.
Figure 5:
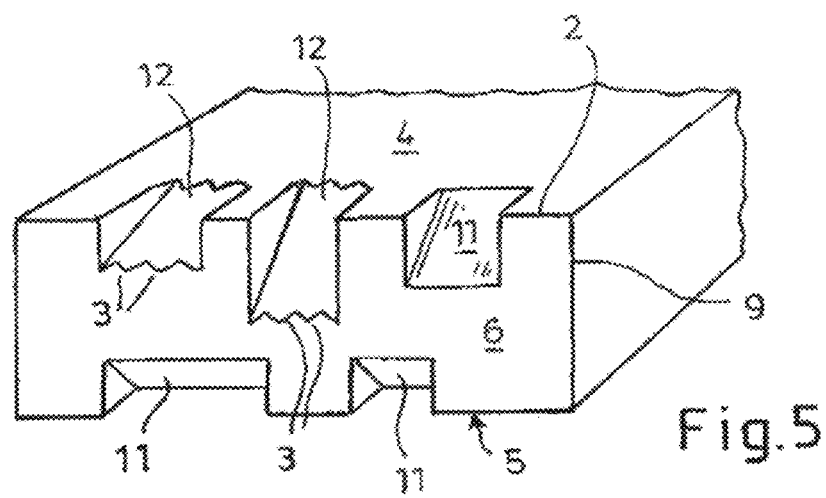
FIG. 5 shows an embodiment wherein all laser holes are put in only from one side face, but the recesses are put in also from the opposing side face.

FIGS. 4 and 5 show individual components 9 after separation from a component 1, wherein the laser holes 3 are combined in each case in two groups 12. Besides said groups 12 of laser holes 3, recesses 11 are arranged in the fracture surface 6. In this embodiment, the laser holes 3 of a group 12 all have the same depth, wherein the laser holes 3 of the one group 12 have a different depth than the laser holes of the other group 12. In the embodiment according to FIG. 4, the laser holes 3 are put in from only one side face 4. In the embodiment according to FIG. 5, likewise, all laser holes 3 are put in only from one side face 4, but the recesses 11 are put in also from the opposing side face 5.

Figure 6A:
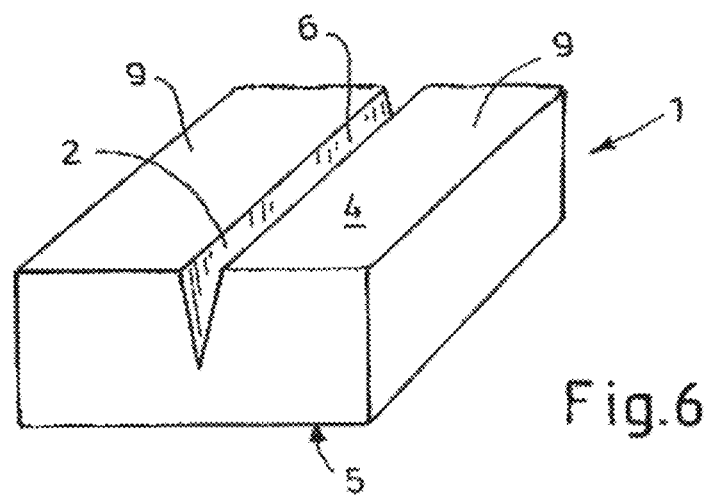
FIG. 6a shows a component after lasering the laser track and prior to separating.
Figure 6B:
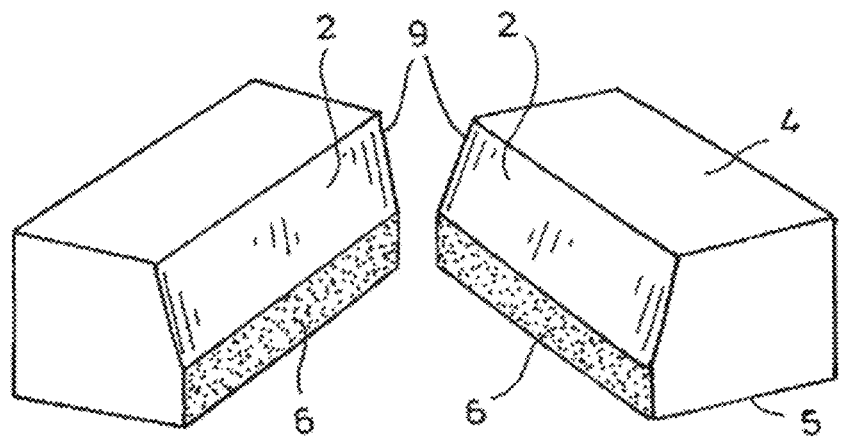
FIG. 6b shows two individual components generated from the component 1 of FIG. 1 by separating.

FIG. 6a shows a component 1 after lasering the laser track 2 and prior to separating. A notch-shaped laser track 2 has been created. FIG. 6b shows two individual components 9 generated from the component 1 of FIG. 1 by separating. In both figures, the laser track, or half of the laser track (in FIG. 6b), is designated by 2. The fracture surface 6 has a reduced material thickness.

The invention claimed is:

1. A component comprising a laser track as a fracture initiation line, said laser track consisting of laser holes formed by a laser beam for preparing for a later separation of the component into individual components, wherein the distance A between two adjacent laser holes is smaller or equal to the diameter D of said laser holes, in each case measured on the surface of the component; wherein the components are ceramic plates which are used as substrates for electronic or electric components, and wherein the laser track is created in opposing side faces of the component.

2. The component according to claim 1, wherein the depth H of the laser holes is equal.

3. A method for producing a component according to claim 2, wherein during the irradiation time of the component, at least one of the laser beam and the component are moved so as to create the laser track in the component.

4. The component according to claim 2, wherein the component comprises a material selected from the group consisting of a semiconductor material, aluminum oxide, zirconium oxide and a mixed ceramic.

5. The component according to claim 1, wherein the depth H of the laser holes is unequal.

6. A method for producing a component according to claim 5, wherein during the irradiation time of the component, at least one of the laser beam and the component are moved so as to create the laser track in the component.

7. The component according to claim 5, wherein the component comprises a material selected from the group consisting of a semiconductor material, aluminum oxide, zirconium oxide and a mixed ceramic.

8. The component according to claim 1, wherein the components have congruent laser tracks on opposing side faces.

9. The component according to claim 8, wherein the component comprises a material selected from the group consisting of a semiconductor material, aluminum oxide, zirconium oxide and a mixed ceramic.

10. The component according to claim 1, wherein the component comprises a material selected from the group consisting of a semiconductor material, aluminum oxide, zirconium oxide and a mixed ceramic.

11. A method for producing a component according to claim 1, wherein during the irradiation time of the component, at least one of the laser beam and the component are moved so as to create the laser track in the component.

12. The method according to claim 1, wherein a laser hole is put in at least a second time at the same place.

13. A method for producing a component according to claim 1, wherein during the irradiation time of the component, at least one of the laser beam and the component are moved so as to create the laser track in the component.

14. The component according to claim 1, wherein the component comprises a material selected from the group consisting of a semiconductor material, aluminum oxide, zirconium oxide and a mixed ceramic.

* * * * *